United States Patent
Sasaki et al.

(10) Patent No.: US 10,199,512 B2
(45) Date of Patent: Feb. 5, 2019

(54) HIGH VOLTAGE WITHSTAND GA2O3-BASED SINGLE CRYSTAL SCHOTTKY BARRIER DIODE

(71) Applicants: TAMURA CORPORATION, Tokyo (JP); National Institute of Information and Communications Technology, Tokyo (JP); National University Corporation Tokyo University of Agriculture and Technology, Tokyo (JP)

(72) Inventors: Kohei Sasaki, Tokyo (JP); Ken Goto, Tokyo (JP); Masataka Higashiwaki, Tokyo (JP); Akinori Koukitu, Tokyo (JP); Yoshinao Kumagai, Tokyo (JP); Hisashi Murakami, Tokyo (JP)

(73) Assignees: TAMURA CORPORATION, Tokyo (JP); NATIONAL INSTITUTE OF INFORMATION AND COMMUNICATIONS TECHNOLOGY, Tokyo (JP); NATIONAL UNIVERSITY CORPORATION TOKYO UNIVERSITY OF AGRICULTURE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/559,702

(22) PCT Filed: Mar. 9, 2016

(86) PCT No.: PCT/JP2016/057421
§ 371 (c)(1),
(2) Date: Sep. 19, 2017

(87) PCT Pub. No.: WO2016/152536
PCT Pub. Date: Sep. 29, 2016

(65) Prior Publication Data
US 2018/0254355 A1     Sep. 6, 2018

(30) Foreign Application Priority Data
Mar. 20, 2015    (JP) ................................. 2015-058519

(51) Int. Cl.
*H01L 21/02*     (2006.01)
*H01L 29/872*     (2006.01)
(Continued)

(52) U.S. Cl.
CPC ............. *H01L 29/872* (2013.01); *C23C 16/40* (2013.01); *C30B 15/34* (2013.01); *C30B 25/20* (2013.01);
(Continued)

(58) Field of Classification Search
CPC ......... H01L 21/02565; H01L 21/02573; H01L 21/02634; H01L 29/24; H01L 29/47; H01L 29/872; H01L 29/66969
See application file for complete search history.

(56) References Cited

U.S. PATENT DOCUMENTS 9,171,967 B2   10/2015   Takizawa et al.
9,412,882 B2    8/2016   Takizawa et al.
(Continued)

FOREIGN PATENT DOCUMENTS

EP    2 779 242 A1   9/2014
EP    3 054 037 A1   8/2016
(Continued)

OTHER PUBLICATIONS

International Search Reprot issued in International Application No. PCT/JP2016/057421 dated May 10, 2016.
(Continued)

*Primary Examiner* — Andrew Q Tran
(74) *Attorney, Agent, or Firm* — Scully, Scott, Murphy & Presser, P.C.

(57) ABSTRACT

A high withstand voltage Schottky barrier diode includes a first layer that includes a first $Ga_2O_3$-based single crystal including a first Group IV element and Cl at a concentration of not more than $5\times10^{16}$ cm$^{-3}$ and that has an effective donor concentration of not less than $1\times10^{13}$ and not more than $6.0\times10^{17}$ cm$^{-3}$, a second layer that includes a second Ga$_2$O$_3$-based single crystal including a second Group IV element and that has a higher effective donor concentration than the first layer and is laminated on the first layer, an anode electrode formed on the first layer, and a cathode electrode formed on the second layer.

12 Claims, 6 Drawing Sheets

(51) Int. Cl.
C23C 16/40 (2006.01)
C30B 29/16 (2006.01)
H01L 29/47 (2006.01)
H01L 29/24 (2006.01)
C30B 15/34 (2006.01)
C30B 25/20 (2006.01)
H01L 29/66 (2006.01)

(52) U.S. Cl.
CPC ........ *C30B 29/16* (2013.01); *H01L 21/02565* (2013.01); *H01L 21/02573* (2013.01); *H01L 21/02634* (2013.01); *H01L 29/24* (2013.01); *H01L 29/47* (2013.01); *H01L 29/66969* (2013.01)

(56) References Cited

U.S. PATENT DOCUMENTS

| | | | |
|---|---|---|---|
| 9,437,689 B2 | 9/2016 | Sasaki et al. | |
| 9,461,124 B2 | 10/2016 | Sasaki et al. | |
| 9,595,586 B2 | 3/2017 | Takizawa et al. | |
| 2010/0127255 A1* | 5/2010 | Allen | H01L 29/22 257/43 |
| 2014/0217405 A1 | 8/2014 | Sasaki et al. | |
| 2014/0217469 A1 | 8/2014 | Sasaki et al. | |
| 2014/0332823 A1 | 11/2014 | Takizawa et al. | |
| 2015/0129894 A1* | 5/2015 | Kinoshita | H01L 29/6606 257/77 |
| 2016/0043238 A1 | 2/2016 | Takizawa et al. | |
| 2016/0265137 A1 | 9/2016 | Goto et al. | |
| 2016/0300953 A1 | 10/2016 | Sasaki et al. | |
| 2016/0322467 A1 | 11/2016 | Takizawa et al. | |
| 2016/0365418 A1 | 12/2016 | Sasaki et al. | |
| 2017/0162655 A1 | 6/2017 | Takizawa et al. | |
| 2017/0301799 A1* | 10/2017 | Boles | H01L 29/0649 |

FOREIGN PATENT DOCUMENTS

| | | |
|---|---|---|
| JP | 2013-56803 A | 3/2013 |
| JP | 2013-58637 A | 3/2013 |
| JP | 2013-82587 A | 5/2013 |
| JP | 2013-102081 A | 5/2013 |
| WO | 2013/035842 A | 3/2013 |
| WO | 2013/035845 A1 | 3/2013 |

OTHER PUBLICATIONS

Murakami, H., et al. "Homoepitaxial growth of β-Ga2O3 layers by halide vapor phase epitaxy" Applied Physics Express 8::015503-1 to 015503-4 (published online Dec. 11, 2014).

Sasaki, K., et al. "Device-Quality β-Ga2O3 Epitaxial Films Fabricated by Ozone Molecular Beam Epitaxy" Applied Physics Express 5:035502-1 to 035502-3 (published online Feb. 28, 2012).

International Preliminary Report on Patentability dated Oct. 5, 2017 issued in International Application No. PCT/JP2016/057421.

Sasaki, K. et al., "MBE grown Ga2O3 and Its Power Device Applications", Journal of Crystal Growth, vol. 378, Sep. 1, 2013, pp. 591-595.

Extended Supplementary European Search Report dated Oct. 12, 2018 in European Patent Application No. 16 76 8439.8.

* cited by examiner

HIGH VOLTAGE WITHSTAND GA2O3-BASED SINGLE CRYSTAL SCHOTTKY BARRIER DIODE

TECHNICAL FIELD

The invention relates to a high-withstand voltage Schottky barrier diode.

BACKGROUND ART

Known as a method for doping a $Ga_2O_3$-based single crystal are a method in which a dopant is added during crystal growth by the MBE (Molecular Beam Epitaxy) method or the EFG (Edge-defined Film-fed Growth) method (see. e.g., PTLs 1 and 2) and a method in which a dopant is added to a grown $Ga_2O_3$-based single crystal by ion implantation (see e.g. PTL 3). Also, a Schottky barrier diode formed of a $Ga_2O_3$-based compound semiconductor (e.g. PTL 4) is known.

CITATION LIST

Patent Literature

[PTL 1]
JP-A-2013-056803
[PTL 2]
JP-A-2013-082587
[PTL 3]
JP-A-2013-058637
[PTL 4]
JP-A-2013-102081

SUMMARY OF INVENTION

Technical Problem

When using the MIRE method, however, impurities are likely to segregate during epitaxial crystal growth and uniformity of dopant concentration distribution in depth and in-plane directions is poor.

Also, in the EFG method, since a raw material contains an impurity at a concentration of about $1 \times 10^{17}$ $cm^{-3}$, doping with a lower concentration is not possible.

Also, in the ion implantation, implantation depth of the impurity ion is limited to about 1 pin. Furthermore, since the ion beam damages the crystal, the crystallinity deteriorates.

Thus, by the prior arts, it is not possible to form a $Ga_2O_3$-based single crystal containing a desired concentration of donor as well as having high uniformity of donor concentration distribution; and it is difficult to manufacture a $Ga_2O_3$-based Schottky barrier diode with excellent withstand voltage characteristics.

Thus, it is one of objects of the invention to provide a $Ga_2O_3$-based high-withstand voltage Schottky barrier diode that is excellent in withstand voltage characteristics.

Solution to Problem

For completing the abovementioned object, according to an embodiment of the invention, a high-withstand voltage Schottky barrier diode defined by [1] to [6] below is provided.

[1] A high withstand voltage Schottky barrier diode, comprising: a first layer that comprises a first $Ga_2O_3$-based single crystal including a first Group IV element and Cl at a concentration of not more than $5 \times 10^{16}$ $cm^{-3}$ and has an effective donor concentration of not less than $1 \times 10^{13}$ and not more than $6.0 \times 10^{17}$ $cm^{-3}$; a second layer that comprises a second $Ga_2O_3$-based single crystal including a second Group IV element and that has a higher effective donor concentration than the first layer and is laminated on the first layer; an anode electrode formed on the first layer; and a cathode electrode formed on the second layer.

[2] The high withstand voltage Schottky barrier diode defined by [1], wherein the effective donor concentration of the first layer is not more than $2.0 \times 10^{16}$ $cm^{-3}$.

[3] The high withstand voltage Schottky barrier diode defined by [2], wherein the effective donor concentration of the first layer is not more than $1.4 \times 10^{16}$ $cm^{-3}$.

[4] The high withstand voltage Schottky barrier diode defined by any one of [1] to [3], wherein the first Group IV element comprises Si.

[5] The high withstand voltage Schottky barrier diode defined by any one of [1] to [3], wherein the first $Ga_2O_3$-based single crystal comprises a $Ga_2O_3$ single crystal.

[6] The high withstand voltage Schottky barrier diode defined by any one of [1] to [3], wherein a layer of the cathode electrode contacts with the second layer and comprises Ti.

Advantageous Effects of Invention

According to the invention, it is possible to provide a $Ga_2O_3$-based high-withstand voltage Schottky barrier diode that is excellent in withstand voltage characteristics.

DESCRIPTION OF EMBODIMENT

Embodiment (Configuration of High-Withstand Voltage Schottky Barrier Diode)

Figure 1:
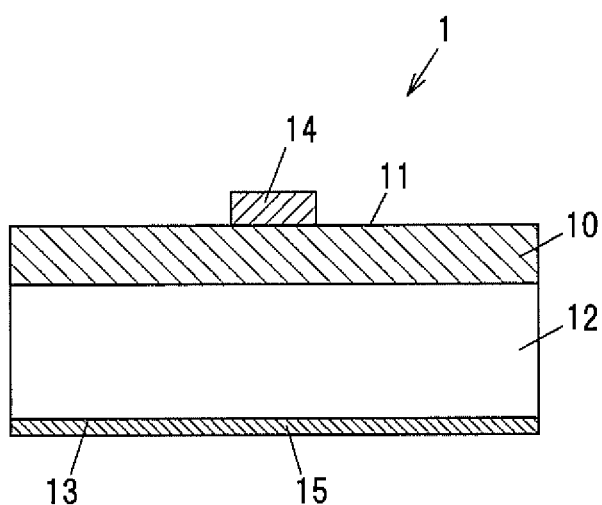
FIG. 1 is a vertical cross-sectional view showing a high-withstand voltage Schottky barrier diode 1 in an embodiment.

FIG. 1 is a vertical cross-sectional view showing a high-withstand voltage Schottky barrier diode 1 in an embodiment. The high-withstand voltage Schottky barrier diode 1 is a vertical Schottky barrier diode and has a first layer 10, a second layer 12 laminated on the first layer 10, an anode electrode 14 formed on the first layer 10, and a cathode electrode 15 formed on the second layer 12, The first layer 10 is formed of a $Ga_2O_3$-based single crystal containing a Group IV element, such as Si or Sn, as a donor. In this regard, Sn is known to tend to segregate, and use of Sn as a donor may cause poor in-plane uniformity of electrical characteristics of the first layer 10 and a decrease in production yield. Therefore, use of Si as a donor is more preferable. An effective donor concentration ($N_d$-$N_a$) of the first layer 10 is not less than $1\times10^{13}$ and not more than $6.0\times10^{17}$ cm$^{-3}$, preferably not more than $2.0\times10^{16}$ cm$^{-3}$, and more preferably not more than $1.4\times10^{16}$ cm$^{-3}$. $N_d$-$N_a$ here is a difference between a donor concentration $N_d$ and an acceptor concentration $N_a$, and corresponds to a concentration of donor which effectively functions.

When $N_d$-$N_a$ of the first layer 10 is not more than $6.0\times10^{17}$ cm$^{-3}$, not more than $2.0\times10^{16}$ cm$^{-3}$, not more than $1.4\times10^{16}$ cm$^{-3}$ and not more than $2.0\times10^{15}$ cm$^3$, the high withstand voltage Schottky barrier diode 1 can have a withstand voltage (breakdown voltage) of not less than 16V, not less than 310V not less than 360V and not less than 440V, respectively. Based on general device evaluation criteria, the withstand voltage as defined here is a magnitude of applied voltage at which a density of reverse leakage current flowing between the anode electrode 14 and the cathode electrode 15 in the high withstand voltage Schottky barrier diode 1 reaches $10^{-3}$ A/cm$^2$.

A higher withstand voltage can be obtained by additionally providing an electric field concentration relaxation structure, such as a field plate structure in which an insulating film is formed at an edge portion of the anode electrode 14 on the surface of the first layer 10, or a guard ring structure in which acceptor ions are implanted in the first layer 10 and at the edge and surrounding portions of the anode electrode 14 on the surface of the first layer 10.

The first layer 10 also contains Cl at a concentration of not more than $5\times10^{16}$ cm$^{-3}$. This results from that the Ga$_2$O$_3$-based single crystal film is formed by the HVPE method using Cl-containing gas. Generally, Cl-containing gas is not used to form a Ga$_2$O$_3$-based single crystal film when using a method other than the HVPE method, and the Ga$_2$O$_3$-based single crystal film does not contain Cl, or at least does not contain $1\times10^{16}$ cm$^{-3}$ or more of The thickness of the first layer 10 is preferably not less than 30 nm so that the high withstand voltage Schottky barrier diode 1 can have sufficient withstand voltage characteristics. The withstand voltage of the high withstand voltage Schottky barrier diode 1 depends on the thickness and $N_d$-$N_a$ of the first layer 10. For example, when $N_d$-$N_a$ of the first layer 10 is $6.0\times10^{17}$ cm$^{-3}$, the withstand voltage of 21V can be obtained as long as the thickness of the first layer 10 is not less than 30 nm. The upper limit of the thickness of the first layer 10 is not specifically limited. However, since electrical resistance in the thickness direction increases with an increase in thickness, the first layer 10 is preferably as thin as possible within the range in which the required withstand voltage characteristics can be obtained.

The Ga$_2$O$_3$-based single crystal here means a Ga$_2$O$_3$ single crystal or is a Ga$_2$O$_3$ single crystal doped with an element such as Al or In, and may be, e.g., a (Ga$_x$Al$_y$In$_{(1-x-y)}$)$_2$O$_3$ ($0<x\le1$, $0\le y<1$, $0<x+y\le1$) single crystal which is a Ga$_2$O$_3$ single crystal doped with Al and In. The band gap is widened by adding Al and is narrowed by adding In. Such Ga$_2$O$_3$ single crystal has, e.g., a β-crystal structure.

The second layer 12 is formed of a second Ga$_2$O$_3$-based single crystal containing a Group IV element, such as Si or Sn, as a donor. $N_d$-$N_a$ of the second layer 12 is higher than that of the first layer 10 and is, e.g., not less than $1\times10^{18}$ and not more than $1.0\times10^{20}$ cm$^{-3}$. The thickness of the second layer 12 is, e.g., 50 to 1000 μm.

Since withstand voltage of the high withstand voltage Schottky barrier diode 1 hardly depends on plane orientations of principal surfaces of the first layer 10 and the second layer 12, the plane orientations of the principal surfaces of the first layer 10 and the second layer 12 are not specifically limited and are, e.g., (001), (010), (110), (210), (310), (610), (910), (101), (102), (201), (401), (-101), (-201), (-102) or (-401), in view of crystal growth rate, etc.

The anode electrode 14 is formed on a surface 11 of the first layer 10, which is a surface on the opposite side to the second layer 12, and is in Schottky contact with the first layer 10.

The anode electrode 14 is formed of a metal such as Pt or Ni. The anode electrode 14 may have a multilayer structure formed by laminating different metal films, e.g., Pt/Au or The cathode electrode 15 is formed on a surface 13 of the second layer 12, which is a surface on the opposite side to the first layer 10, and is in ohmic contact with the second layer 12.

The cathode electrode 15 is formed of a metal such as Ti. The cathode electrode 15 may have a multilayer structure formed by laminating different metal films, e.g., Ti/Au or Ti/Al. A layer constituting the cathode electrode 15 and in contact with the second layer 12 is preferably formed of Ti so that the cathode electrode 15 can be reliably in ohmic contact with the second layer 12, In the high withstand voltage Schottky barrier diode 1, when voltage in a forward direction (electric potential is positive on the anode electrode 14 side) is applied between the anode electrode 14 and the cathode electrode 15, height of the energy barrier at an interface between the anode electrode 14 and the first layer 10 decreases as viewed from the first layer 10 and an electric current flows from the anode electrode 14 to the cathode electrode 15. On the other hand, when voltage in a reverse direction (electric potential is negative on the anode electrode 14 side) is applied between the anode electrode 14 and the cathode electrode 15, an electric current does not flow due to the Schottky barrier.

In the typical structure of the high withstand voltage Schottky barrier diode 1, the second layer 12 is a Ga$_2$O$_3$-based substrate and the first layer 10 is a Ga$_2$O$_3$-based single crystal film epitaxially grown on the second layer 12. When the second layer 12 is a Ga$_2$O$_3$-based substrate, the second layer 12 is not formed by the method and thus practically does not contain Cl.

As an alternative, the high withstand voltage Schottky barrier diode 1 can have another structure in which both the first layer 10 and the second layer 12 are epitaxial films. In this case, the first layer 10 and the second layer 12 are, e.g., epitaxially grown on a base substrate formed of a Ga$_2$O$_3$-based single crystal and then separated from the base substrate. In this case, the thickness of the second layer 12 is, e.g., 0.1 to 50 μm.

(Method for Manufacturing High Withstand Voltage Schottky Barrier Diode)

An example of a method for manufacturing the high withstand voltage Schottky barrier diode 1 will be described below. In this example, a Ga$_2$O$_3$-based single crystal film as the first layer 10 is epitaxially grown on a Ga$_2$O$_3$-based substrate as the second layer 12.

Firstly, a bulk crystal of a Ga$_2$O$_3$-based single crystal grown by a melt-growth technique such as the FZ (Floating Zone) method or the EFG (Edge Defined Film Fed Growth) method is sliced and the surface thereof is then polished, thereby forming a Ga$_2$O$_3$-based substrate as the second layer 12.

Next, a $Ga_2O_3$-based single crystal film as the first layer 10 is epitaxially grown on the $Ga_2O_3$-based substrate by the HVPE (Halide Vapor Phase Epitaxy) method.

Figure 2:
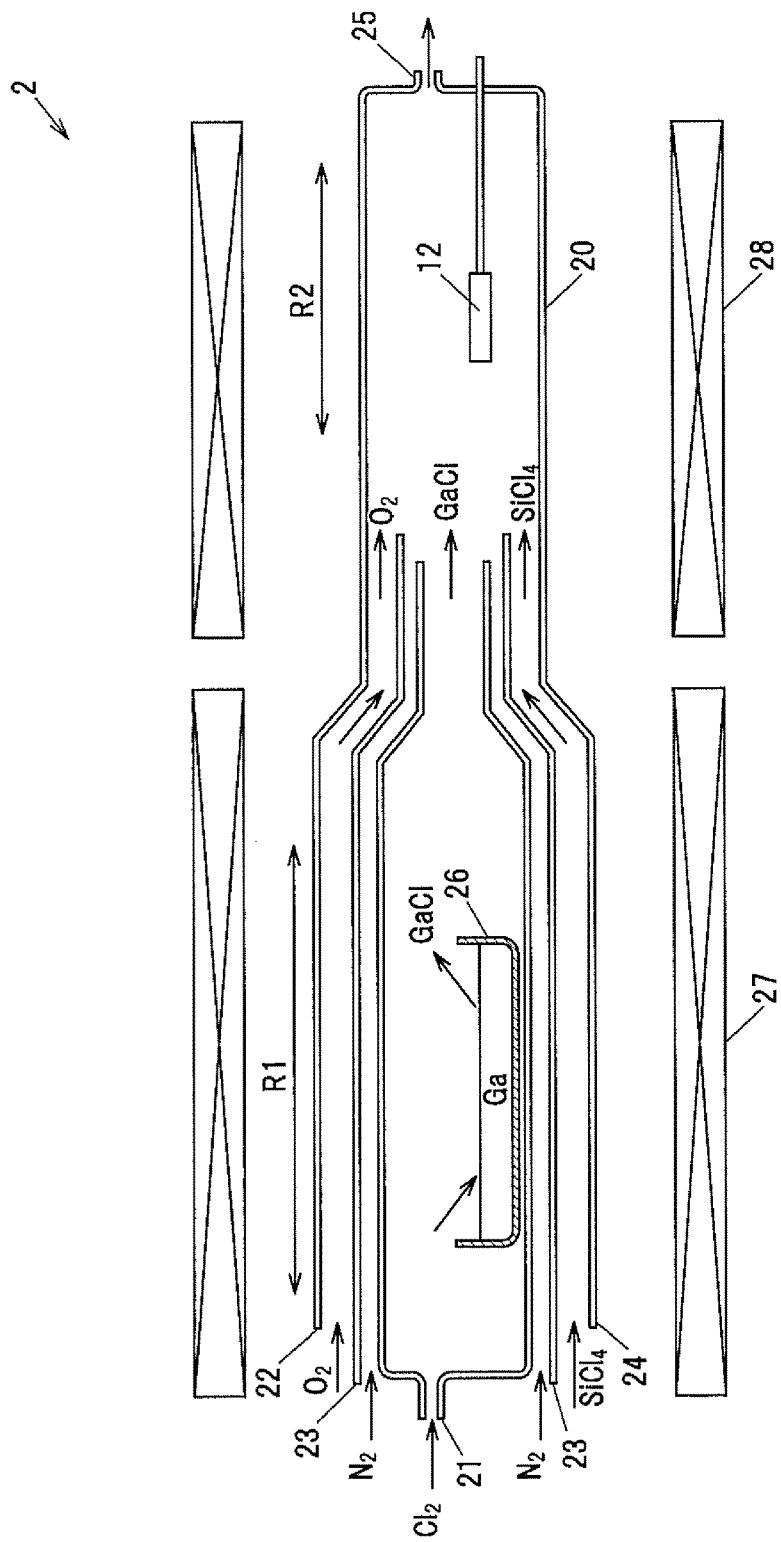
FIG. 2 is a vertical cross-sectional view showing a vapor phase deposition system designed to use the HVPE method.

FIG. 2 is a vertical cross-sectional view showing a vapor phase deposition system 2 designed to use the HVPE method. The vapor phase deposition system 2 has a reaction chamber 20 having a first gas introducing port 21, a second gas introducing port 22, a third gas introducing port 23, a fourth gas introducing port 24 and an exhaust port 25, and a first heating means 27 and a second heating means 28 which are placed to surround the reaction chamber 20 to heat predetermined regions in the reaction chamber 20.

The growth rate when using the HVPE method is higher than that in the MBE method, etc. In addition, in-plane distribution of film thickness is highly uniform and it is possible to grow a large-diameter film. Therefore, it is suitable for mass production of crystal.

The reaction chamber 20 has a source reaction region R1 in which a reaction container 26 containing a Ga source is placed and a gallium source gas is produced, and a crystal growth region R2 in which the $Ga_2O_3$-based substrate is placed and the $Ga_2O_3$-based single crystal film is grown thereon. The reaction chamber 20 is formed of, e.g., quartz glass.

Here, the reaction container 26 is formed of, e.g., quartz glass and the Ga source contained in the reaction container 26 is metal gallium.

The first heating means 27 and the second heating means 28 are capable of respectively heating the source reaction region R1 and the crystal growth region R2 of the reaction chamber 20. The first heating means 27 and the second heating means 28 are, e.g., resistive heaters or radiation heaters.

The first gas introducing port 21 is a port for introducing a Cl-containing gas ($Cl_2$ gas or HCl gas) into the source reaction region R1 of the reaction chamber 20 using an inert carrier gas ($N_2$ gas, Ar gas or He gas). The second gas introducing port 22 is a port for introducing an oxygen-containing gas ($O_2$ gas or $H_2O$ gas, etc.) as an oxygen source gas into the crystal growth region R2 of the reaction chamber 20 using an inert carrier gas ($N_2$ gas, Ar gas or He gas). The third gas introducing port 23 is a port for introducing an inert carrier gas ($N_2$ gas, Ar gas or He gas) into the crystal growth region R2 of the reaction chamber 20. The fourth gas introducing port 24 is a port for introducing a source gas of a dopant to be added to the $Ga_2O_3$-based single crystal film, such as Si (e.g., silicon tetrachloride, etc.), into the crystal growth region R2 of the reaction chamber 20 using an inert carrier gas ($N_2$ gas, Ar gas or He gas).

To grow the $Ga_2O_3$-based single crystal film, it is possible to use a technique of growing $Ga_2O_3$-based single crystal film disclosed by Japanese patent application No. 2014-088589. A process of growing the $Ga_2O_3$-based single crystal film in the present embodiment will be described below as an example.

Firstly, the source reaction region R1 of the reaction chamber 20 is heated by the first heating means 27 and an atmosphere temperature in the source reaction region R1 is then maintained at a predetermined temperature.

Next, in the source reaction region R1, a Cl-containing gas introduced through the first gas introducing port 21 using a carrier gas is reacted with the metal gallium in the reaction container 26 at the above-mentioned atmosphere temperature, thereby producing a gallium chloride gas.

The atmosphere temperature in the source reaction region R1 here is preferably a temperature at which GaCl gas has the highest partial pressure among component gases of the gallium chloride gas produced by the reaction of the metal gallium in the reaction container 26 with the Cl-containing gas. The gallium chloride gas here contains GaCl gas, $GaCl_2$ gas, $GaCl_3$ gas and $(GaCl_3)_2$ gas, etc.

The temperature at which a driving force for growth of $Ga_2O_3$ crystal is maintained is the highest with the GaCl gas among the gases contained in the gallium chloride gas. Growth at a high temperature is effective to obtain a high-quality $Ga_2O_3$ crystal with high purity. Therefore, for growing the $Ga_2O_3$-based single crystal film, it is preferable to produce a gallium chloride gas in which a partial pressure of GaCl gas having a high driving force for growth at a high temperature is high.

It is possible to increase a partial pressure ratio of the GaCl gas in the gallium chloride gas by reacting the metal gallium with the Cl-containing gas at an atmosphere temperature of about not less than 300° C. Therefore, it is preferable that the metal gallium in the reaction container 26 be reacted with the Cl-containing gas in a state that the atmosphere temperature in the source reaction region R1 is maintained at not less than 300° C. by using the first heating means 27.

At the atmosphere temperature of, e.g., 850° C., the partial pressure ratio of the GaCl gas is predominantly high (the equilibrium partial pressure of the GaCl gas is four orders of magnitude greater than the $GaCl_2$ gas and is eight orders of magnitude greater than the $GaCl_3$ gas) and the gases other than GaCl gas hardly contribute to the growth of $Ga_2O_3$ crystal.

Also, considering the lifetime of the first heating means 27 and heat resistance of the reaction chamber 20 formed of quartz glass, etc., it is preferable that the metal gallium in the reaction container 26 be reacted with the Cl-containing gas in a state that the atmosphere temperature in the source reaction region R1 is maintained at not more than 1000° C.

In addition, if hydrogen is contained in an atmosphere for growing the $Ga_2O_3$-based single crystal film, surface flatness and a driving force for growth of the $Ga_2O_3$-based single crystal film decrease. Therefore, it is preferable that a $Cl_2$ gas not containing hydrogen be used as the Cl-containing gas.

Next, in the crystal growth region R2, the gallium chloride gas produced in the source reaction region R1 is mixed with the oxygen-containing gas introduced through the second gas introducing port 22 and the dopant source gas such as Si introduced through the fourth gas introducing port 24, the $Ga_2O_3$-based substrate is then exposed to the mixed gas, and the $Ga_2O_3$-based single crystal film containing the dopant is thereby epitaxially grown on the $Ga_2O_3$-based substrate. At this time, in a furnace housing the reaction chamber 20, pressure in the crystal growth region R2 is maintained at, e.g., 1 atm.

The dopant source gas used here is preferably a chloride-based gas to prevent other unintentional impurities from being mixed. For example, when Si, Ge, Sn or Pb is used as a dopant, a chloride-based gas such as $SiCl_4$, $GeCl_4$, $SnCl_4$ or $PbCl_2$, respectively, is used. Here, the chloride-based gas is not limited to a compound of an element with only chlorine, and may be, e.g., a silane-based gas such as $SiHCl_3$.

The dopant such as Si is doped during growth of the $Ga_2O_3$-based single crystal (in-situ doping).

If hydrogen is contained in an atmosphere for growing the $Ga_2O_3$-based single crystal film, surface flatness and a driving force for growth of the $Ga_2O_3$-based single crystal film decrease. Therefore, it is preferable that an $O_2$ gas not containing hydrogen be used as the oxygen-containing gas.

Also, according as the equilibrium partial pressure of the GaCl gas decreases, the GaCl gas is consumed in growth of $Ga_2O_3$ crystal and the $Ga_2O_3$ crystal grows efficiently. For example, the equilibrium partial pressure of the GaCl gas sharply falls when a ratio of the supplied partial pressure of the $O_2$ gas to the supplied partial pressure of the GaCl gas (the $O_2$/GaCl supplied partial pressure ratio) is not less than 0.5. Therefore, to efficiently grow the $Ga_2O_3$-based single crystal film, the $Ga_2O_3$-based single crystal film is preferably grown in a state that the $O_2$/GaCl supplied partial pressure ratio in the crystal growth region R2 is not less than 0.5.

Figure 3:
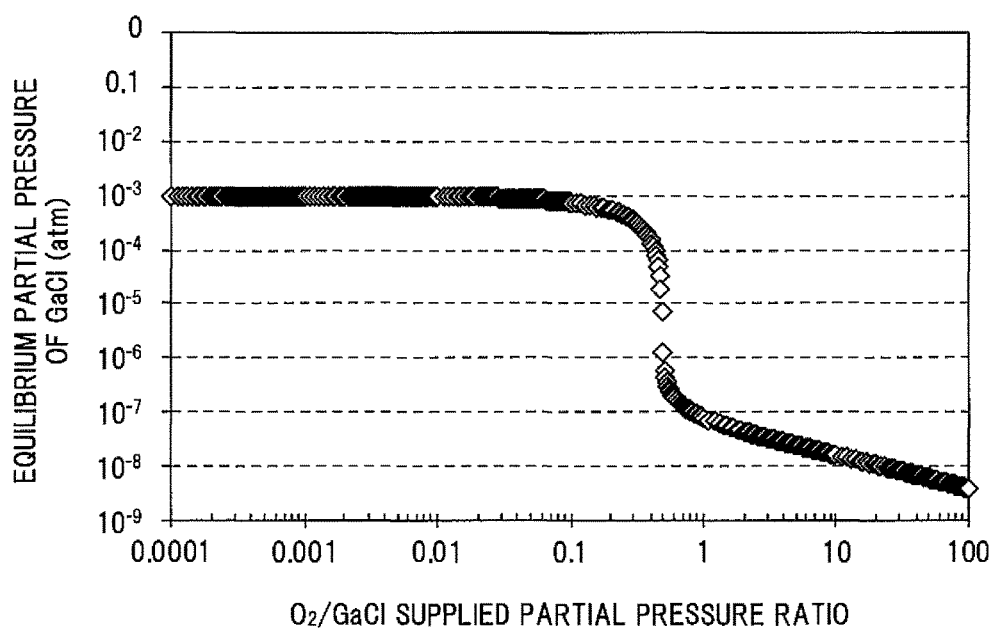
FIG. 3 is a graph which is obtained by thermal equilibrium calculation and shows a relation between equilibrium partial pressure of GaCl and an $O_2$/GaCl supplied partial pressure ratio when the atmosphere temperature during $Ga_2O_3$ crystal growth is 1000° C.

FIG. 3 is a graph which is obtained by thermal equilibrium calculation and shows a relation between an equilibrium partial pressure of GaCl and an $O_2$/GaCl supplied partial pressure ratio when the atmosphere temperature during $Ga_2O_3$ crystal growth is 1000° C. It is calculated using the supplied partial pressure value of the GaCl gas fixed to $1\times10^{-3}$ atm, a furnace pressure of 1 atom adjusted by using, e.g., an inert gas such as $N_2$ as a carrier gas, and various values of the $O_2$ gas supplied partial pressure.

In FIG. 3, the horizontal axis indicates the $O_2$/GaCl supplied partial pressure ratio and the vertical axis indicates an equilibrium partial pressure (atm) of GaCl gas. It is shown that the smaller the equilibrium partial pressure of the GaCl gas, the more the GaCl gas is consumed for growth of $Ga_2O_3$ crystal, i.e., the $Ga_2O_3$ crystal grows efficiently.

FIG. 3 shows that the equilibrium partial pressure of the GaCl gas sharply falls at the $O_2$/GaCl supplied partial pressure ratio of not less than 0.5.

Also, a growth temperature of not less than 900° C. is required to grow the $Ga_2O_3$-based single crystal film. A single crystal may not be obtained at less than 900° C.

Undoped $Ga_2O_3$-based single crystal films grown by the HVPE method have a residual carrier concentration of not more than $1\times10^{13}$ cm$^{-3}$, as disclosed by Japanese patent application No. 2014-088589. Therefore, $N_d\text{-}N_a$ of the $Ga_2O_3$-based single crystal film can be changed in the range of not less than $1\times10^{13}$ cm$^{-3}$ by changing the Group IV element doping concentration.

After growing the $Ga_2O_3$-based single crystal film on the $Ga_2O_3$-based substrate, the surface of the $Ga_2O_3$-based single crystal film is flattened by CMP (Chemical Mechanical Polishing). For example, surface roughness (RMS) of not more than 1 nm is obtained when polished 2 μm in a depth direction. Reducing the surface roughness by the flattening process prevents local electric field concentration when reverse voltage is applied to the anode electrode, resulting in improvement in withstand voltage of the Schottky barrier diode. In this regard, if RMS is not more than 1 nm immediately after completion of growth, the flattening process does not need to be performed.

It is preferable to also polish a surface of the $Ga_2O_3$-based substrate on the opposite side to the $Ga_2O_3$-based single crystal film. Since unwanted substances are sometimes attached to the back surface of the substrate due to source gases flowing around to the back side during HVPE growth of the $Ga_2O_3$-based single crystal film, not performing the polishing process may result in an increase in contact resistance between the substrate and the cathode electrode. In case that the polishing process is performed, such substances can be removed and it is possible to stably form a cathode electrode with low contact resistance. Although the polishing amount in the depth direction is not specifically limited, at least 1 μm or more should be polished for such purpose.

Next, the anode electrode 14 and the cathode electrode 15 are formed respectively on the surface 11 of the $Ga_2O_3$-based single crystal film as the first layer 10 and the surface 13 of the $Ga_2O_3$-based substrate as the second layer 12.

When the second layer 12 is an epitaxial layer, the second layer 12 is formed on a base substrate by the HVPE method in the same manner as the method of forming the first layer 10 described above. This base substrate is removed from the second layer 12 before forming the cathode electrode 15.

Effects of the Embodiment

In the embodiment, the first layer 10, or the first layer 10 and the second layer 12, containing a desired concentration of donor and having high uniformity of donor concentration distribution can be obtained by adding a dopant while growing the $Ga_2O_3$-based single crystal using the HVPE method. As a result, it is possible to obtain the high withstand voltage Schottky barrier diode 1 having excellent withstand voltage characteristics.

EXAMPLES

Next, manufacturing of the high withstand voltage Schottky barrier diode 1 in the embodiment and the evaluation result will be described using Example. In Example, a $Ga_2O_3$ single crystal film as the first layer 10 was epitaxially grown on a $Ga_2O_3$ substrate as the second layer 12 having a (001)-oriented principal surface.

Firstly, a Sn-doped $Ga_2O_3$ single crystal grown by the EFG method was sliced and polished, thereby forming plural $Ga_2O_3$ substrates. $N_d\text{-}N_a$ of the $Ga_2O_3$ substrates was about $2.5\times10^{18}$ cm$^{-3}$. The thickness of the $Ga_2O_3$ substrates was about 650 μm.

Next, a Si-doped $Ga_2O_3$ single crystal films having a thickness of about 10 μm was grown on each of the plural $Ga_2O_3$ substrates by the HVPE method. The $Ga_2O_3$ single crystal films respectively had a Si concentration of about $2.0\times10^{15}$ cm$^{-3}$, $1.4\times10^{16}$ cm$^{-3}$, $2.0\times10^{16}$ cm$^{-3}$, $1.0\times10^{17}$ cm$^{-3}$, $1.5\times10^{17}$ cm$^{-3}$, $2.9\times10^{17}$ cm$^{-3}$ and $6.0\times10^{17}$ cm$^{-3}$.

After the HVPE growth, each $Ga_2O_3$ single crystal film was treated by CMP from the surface to a depth of about 2 to 3 μm and was thereby flattened. The surface of the $Ga_2O_3$ substrate on the opposite side to the $Ga_2O_3$ single crystal film was also flattened by grinding, polishing and CMP from the surface to a depth of about 50 μm.

Next, a cathode electrode composed of a lamination of a 20 nm-thick Ti film and a 230 nm-thick Au film was formed on the $Ga_2O_3$ substrate by vapor deposition.

Next, a circular anode electrode composed of a lamination of a 15 nm-thick Pt film, a 5 nm-thick Ti film and a 250 nm-thick Au film was formed the $Ga_2O_3$ single crystal film. The diameter of the anode electrode was 200 μm for current-voltage (I-V) measurement and 400 μm for capacitance-voltage (C-V) measurement.

Seven types of Schottky barrier diodes having different Si concentrations were obtained through the steps described above.

Figure 4:
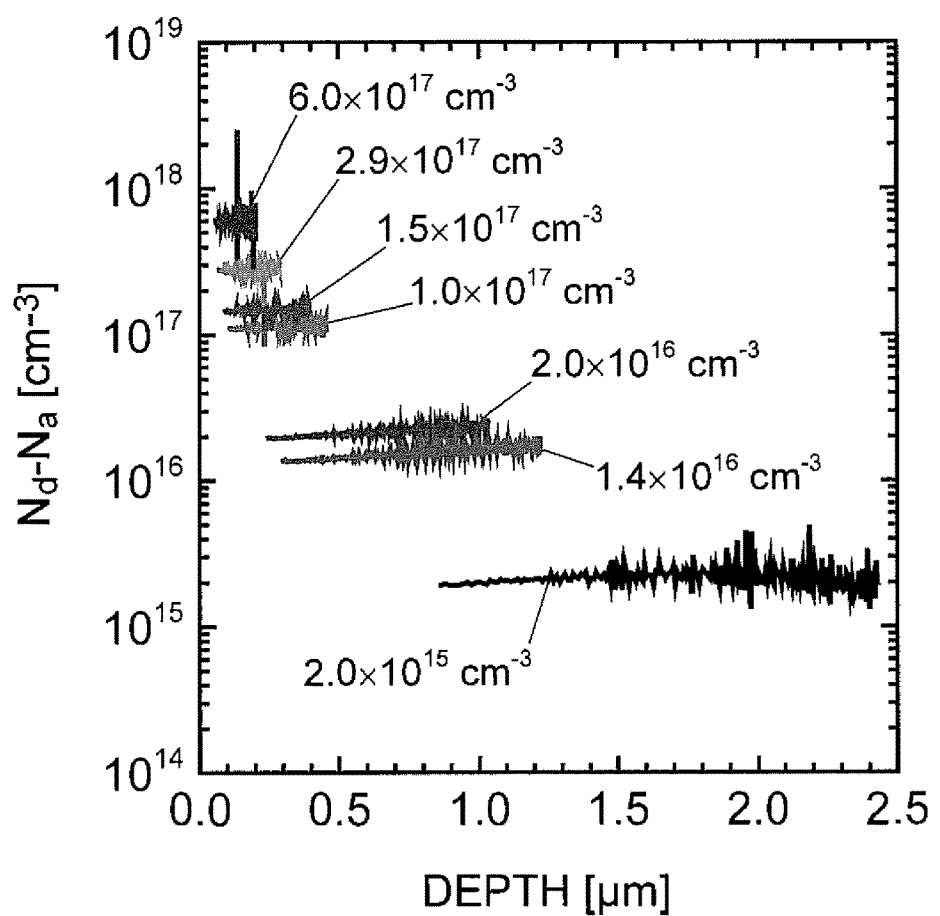
FIG. 4 is a graph showing $N_d$-$N_a$ profiles in a depth direction of $Ga_2O_3$ single crystal films of seven types of Schottky barrier diodes, based on calculation using C-V measurement results.

FIG. 4 is a graph showing $N_d\text{-}N_a$ profiles in a depth direction of $Ga_2O_3$ single crystal films of seven types of Schottky barrier diodes, based on calculation using C-V measurement results. The $Ga_2O_3$ single crystal films of the seven Schottky barrier diodes respectively had $N^d\text{-}N_a$ of about $2.0\times10^{15}$ cm$^{-3}$, $1.4\times10^{16}$ cm$^{-3}$, $2.0\times10^{16}$ cm$^{-3}$, $1.0\times10^{17}$ cm$^{-3}$, $1.5\times10^{17}$ cm$^{-3}$, $2.9\times10^{17}$ cm$^{-3}$ and $6.0\times10^{17}$ cm$^{-3}$.

Figure 5:
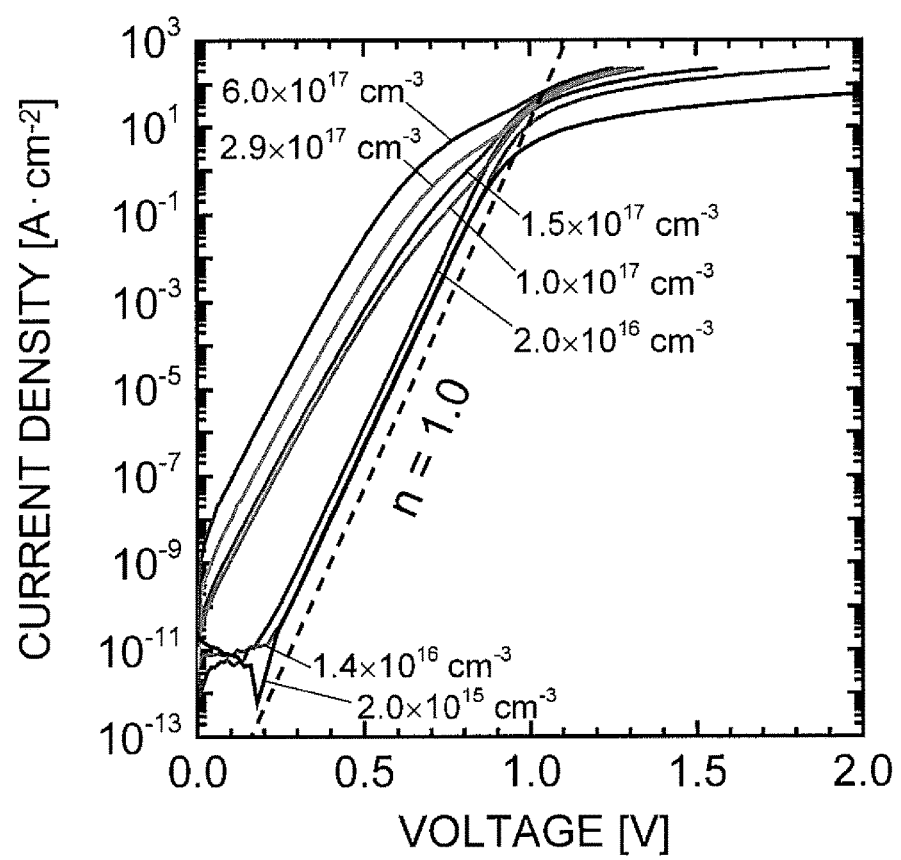
FIG. 5 is a graph showing forward characteristics of the seven types of Schottky barrier diodes.

FIG. 5 is a graph showing forward characteristics of the seven types of Schottky barrier diodes. An inclination of the dotted line in FIG. 5 represents an inclination of I-V curve at lower voltage than the rising voltage when the ideality factor n of Schottky barrier diode is 1 (ideal value). According to FIG. 5 in the Schottky barrier diode having $N_d\text{-}N_a$ of not more than $2\times10^{16}$ cm$^{-3}$, the Schottky ideality factor was about 1.01 to 1.03 and an ideal Schottky contact was formed. On the other hand, in the Schottky barrier diode having $N_d\text{-}N_a$ of not less than $1\times10^{17}$ cm$^{-3}$, the ideality factor was about 1.2 due to leakage current.

Figure 6:
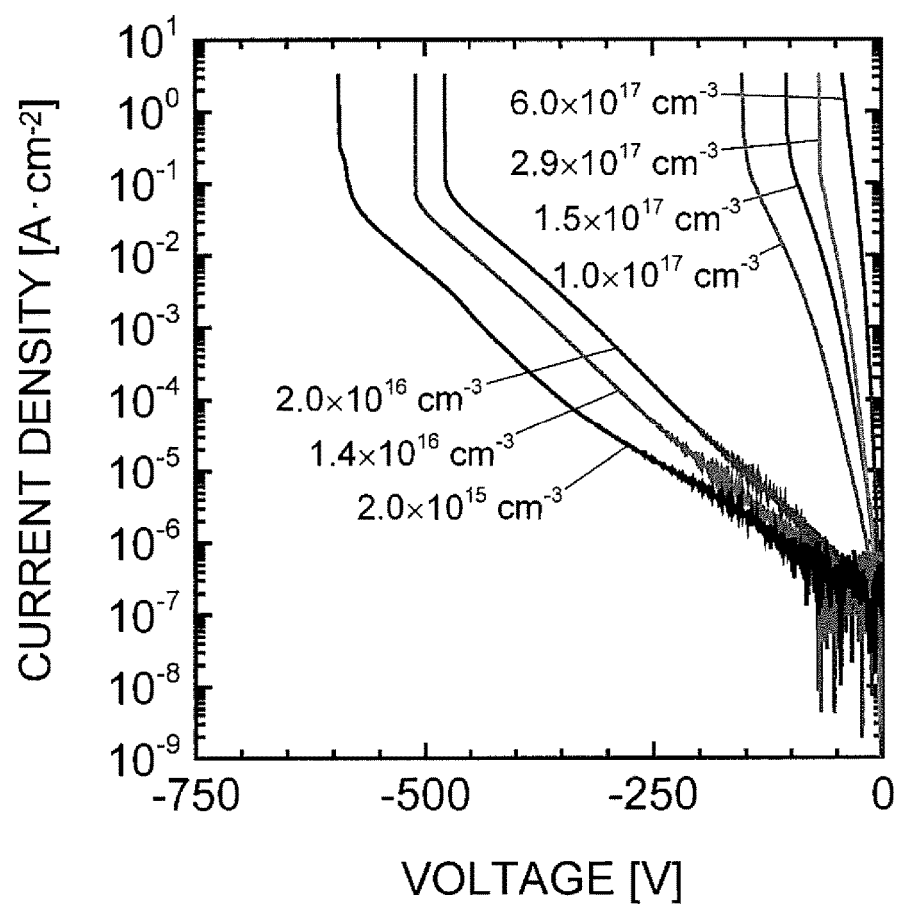
FIG. 6 is a graph showing reverse characteristics of the seven types of Schottky barrier diodes.

FIG. 6 is a graph showing reverse characteristics of the seven types of Schottky barrier diodes. With the decrease in donor concentration, reverse leakage current decreased and withstand voltage increased. The withstand voltage in each profile is the magnitude of voltage at the current density of $10^{-3}$ A/cm$^2$.

According to FIG. 6, the withstand voltage of the Schottky barrier diode having $N_d\text{-}N_a$ of $2.0\times10^{15}$ cm$^{-3}$ was about 440V the withstand voltage of the Schottky barrier diode having $N_d\text{-}N_a$ of $1.4\times10^{16}$ cm$^{-3}$ was about 360V, the withstand voltage of the Schottky barrier diode having $N_d\text{-}N_a$ of $2.0\times10^{16}$ cm$^{-3}$ was about 310V, the withstand voltage of the Schottky barrier diode having $N_d\text{-}N_a$ of $1.0\times10^{17}$ cm$^{-3}$ was about 74V, the withstand voltage of the Schottky barrier diode having $N_d\text{-}N_a$ of $1.5\times10^{17}$ cm$^{-3}$ was about 46V, the withstand voltage of the Schottky barrier diode having $N_d\text{-}N_a$ of $2.9\times10^{17}$ cm$^{-3}$ was about 36V, and the withstand voltage of the Schottky barrier diode having $N_d\text{-}N_a$ of $6.0\times10^{17}$ cm$^{-3}$ was about 16V.

Although the $Ga_2O_3$ substrates having a (001)-oriented principal surface were used as the $Ga_2O_3$-based substrates in the evaluation, similar evaluation results are obtained also when another $Ga_2O_3$-based substrate is used instead of the $Ga_2O_3$ substrate or the plane orientation of the principal surface is different. In addition, similar evaluation results are obtained also when another $Ga_2O_3$-based single crystal film is formed instead of the $Ga_2O_3$ single crystal film.

In addition, although $N_d\text{-}N_a$ of the $Ga_2O_3$ single crystal film was $2.0\times10^{15}$ to $6.0\times10^{17}$ cm$^{-3}$ in the evaluation, higher withstand voltage is obtained when using a $Ga_2O_3$ single crystal film with lower $N_d\text{-}N_a$.

Although the embodiment of the invention has been described, the invention is not intended to be limited to the embodiment, and the various kinds of modifications can be implemented without departing from the gist of the invention.

In addition, the invention according to claims is not to be limited to the embodiment described above. Further, it should be noted that all combinations of the features described in the embodiment are not necessary to solve the problem of the invention.

INDUSTRIAL APPLICABILITY

Provided is a $Ga_2O_3$-based high withstand voltage Schottky barrier diode having excellent withstand voltage characteristics.

REFERENCE SIGNS LIST

1 HIGH WITHSTAND VOLTAGE SCHOTTKY BARRIER DIODE
10 FIRST LAYER
12 SECOND LAYER
14 ANODE ELECTRODE
15 CATHODE ELECTRODE

The invention claimed is:

1. A high withstand voltage Schottky barrier diode, comprising:
a first layer that comprises a first $Ga_2O_3$-based single crystal including a first Group IV element and Cl at a concentration of not more than $5\times10^{16}$ cm$^{-3}$ and that has an effective donor concentration of not less than $1\times10^{13}$ and not more than $6.0\times10^{17}$ cm$^{-3}$;
a second layer that comprises a second $Ga_2O_3$-based single crystal including a second Group IV element and that has a higher effective donor concentration than the first layer and is laminated on the first layer;
an anode electrode formed on the first layer; and
a cathode electrode formed on the second layer.

2. The high withstand voltage Schottky barrier diode according to claim 1, wherein the effective donor concentration of the first layer is not more than $2.0\times10^{16}$ cm$^{-3}$.

3. The high withstand voltage Schottky barrier diode according to claim 2, wherein the effective donor concentration of the first layer is not more than $1.4\times10^{16}$ cm$^{-3}$.

4. The high withstand voltage Schottky barrier diode according to claim 3, wherein the first Group IV element comprises Si.

5. The high withstand voltage Schottky barrier diode according to claim 3, wherein the first $Ga_2O_3$-based single crystal comprises a $Ga_2O_3$ single crystal.

6. The high withstand voltage Schottky barrier diode according to claim 3, wherein a layer of the cathode electrode contacts with the second layer and comprises Ti.

7. The high withstand voltage Schottky barrier diode according to claim 2, wherein the first Group IV element comprises Si.

8. The high withstand voltage Schottky barrier diode according to claim 2, wherein the first $Ga_2O_3$-based single crystal comprises a $Ga_2O_3$ single crystal.

9. The high withstand voltage Schottky barrier diode according to claim 2, wherein a layer of the cathode electrode contacts with the second layer and comprises Ti.

10. The high withstand voltage Schottky barrier diode according to claim 1, wherein the first Group IV element comprises Si.

11. The high withstand voltage Schottky barrier diode according to claim 1, wherein the first $Ga_2O_3$-based single crystal comprises a $Ga_2O_3$ single crystal.

12. The high withstand voltage Schottky barrier diode according to claim 1, wherein a layer of the cathode electrode contacts with the second layer and comprises Ti.

* * * * *